United States Patent [19]

Busman et al.

[11] Patent Number: 5,541,235
[45] Date of Patent: Jul. 30, 1996

[54] ORGANIC SOLUBLE CATIONIC DYES WITH FLUORINATED ALKYLSULFONYL COUNTERIONS

[75] Inventors: Stanley C. Busman, Minneapolis; William M. Lamanna, Stillwater, both of Minn.

[73] Assignee: Minnesota Mining and Manufacturing Company

[21] Appl. No.: 398,724

[22] Filed: Mar. 6, 1995

[51] Int. Cl.[6] ............................................. C08F 2/46
[52] U.S. Cl. ............................ 522/25; 522/29; 522/31
[58] Field of Search ............................. 522/25, 29, 31

[56] References Cited

U.S. PATENT DOCUMENTS

| | | | |
|---|---|---|---|
| 3,423,299 | 1/1966 | Loree et al. | 204/59 |
| 4,039,521 | 8/1977 | Smith | 260/141 |
| 4,115,295 | 9/1978 | Robins et al. | 528/90 |
| 4,472,479 | 9/1984 | Hayes et al. | 428/324 |
| 5,061,605 | 10/1991 | Kawamura et al. | 522/34 |
| 5,064,747 | 11/1991 | Imai et al. | 522/26 |
| 5,273,840 | 12/1993 | Dominey | 429/92 |
| 5,401,618 | 3/1995 | Chapman et al. | 430/330 |

OTHER PUBLICATIONS

Phenyl Ester of the Aci Form of Tris (Trifluoromethylsulfonyl) Methane, Yu L. Yagupol'skii, et al., Translation of Zhurnal Organicheskol Khimii, vol. 26, No. 3 pp. 584–585, Mar. 1990.

Synthesis and Decomposition of Benzenediazonium Tris ((trifluoromethyl) sulfonyl) Methanide $C_6H_5N_2^+$ $(CF_3SO_2)_3C^-$, and Benzenediazonium Bis ((trifluoromethyl) sulfonyl) amide $C_6H_5N_2^+(CF_3SO_2)_2N^-$, and the Cyclic Analogue, $C_6H_5N_2^+SO_2(CF_2)_3SO_2N^{-1}$, Shi–Zhen Zhu, et al, Inorganic Chem. vol. 32 No. 2 pp. 223–226, 1993.

The Chemistry of Synthetic Dyes, vol. IV, Acadamic Press, 1971, by K. Venkataraman, National Chemical Laboratory, Poona, India. pp. 161–211.

Primary Examiner—Mark Chapman
Attorney, Agent, or Firm—Gary L. Griswold; Walter N. Kirn; Mark A. Litman

[57] ABSTRACT

A cationic dye in a ketone solvent, wherein the cationic dye has a counterion which comprises a linear, branched or cyclic highly fluorinated alkylsulfonyl methide or highly fluorinated alkyl sulfonyl imide.

17 Claims, No Drawings

ORGANIC SOLUBLE CATIONIC DYES WITH FLUORINATED ALKYLSULFONYL COUNTERIONS

BACKGROUND OF THE INVENTION

1. Field of the Invention

The present invention relates to cationic dye compounds and a method for increasing their solubility in organic solvents by associating them with fluorinated alkylsulfonyl anions.

2. Background of the Art

Compounds and materials having positively charged ions, cationic materials, tend to have poor solubility in many organic solvents. As many useful types of compositions are based on organic systems, either organic polymeric systems or organic resin systems, reduced solubility in organic systems limits the field of utility of many cationic materials. Amongst the cationic materials which could benefit from increased solubility in organic systems are photoinitiators (particularly those based on iodonium, sulfonium diazonium, and phosphonium salts and salts of organometallic complex cations), polymeric antistatic agents which are positively charged (especially fluorinated, quaternary, or phosphonium cationic materials), transition metal cations, and dyes (for example, as colorants, antihalation dyes, or spectral sensitizing dyes). It has been traditional, particularly in the organic dye art, to attempt to improve dye solubility in organic based compositions, particularly in non-polar organic solutions, by adding ballasting groups to the dye structure. Dye ballasting groups for organic systems are groups which extend from the cationic portion of the dye to increase the solubility of the compound in the solvent. Typical organic solvent ballasting groups would be longer chain alkyl groups.

Various anions have also been used to increase the solubility of cations and organic cationic materials in organic solutions. Amongst the more common anions used for this purpose are $PF_6^-$, $AsF_6^-$, $SbF_6^-$, $RCO_2^-$, $RSO_3^-$, $ArSO_3^-$, tetraphenyl borate, $ClO_4^-$, $I^-$, $I_3^-$, $BF_4^-$, $RArSO_3^-$, and the like, where R is a straight chain, branched chain, or cyclic hydrocarbon or fluorinated hydrocarbon chain of 1–18 carbon atoms, and Ar is a phenyl or naphthyl group.

Although these anions did improve solubility of cations in organic solvents, the effect was often minimal in less polar solvents such a methyl ethyl ketone (MEK) where the solubility of the cation-anion salts is often on the order of only a few milligrams salt per gram of MEK. The fact that such small improvements have been recognized over the years as significant advantages is evidence of the need for further improvement in solubilization of cations in organic solvents and binders. It is often necessary during coating operations for the solubility of salts in the coating solutions to be on the order of 5–50 mg or more per gram of MEK. With the aforementioned anions, it was often necessary to resort to the use of more polar solvents (i.e., more polar than MEK) such as methanol, tetrahydrofuran, dimethylsulfoxide, etc. in combination with MEK to achieve desirable concentrations of cationic materials. The use of more polar solvents is known to sometimes lead to undesirable side effects as coating defects, haziness, or even crystallization of the salt in the dried coating (e.g., blooming of the salt from the dried layer).

Perfluoro-4-ethylcyclohexane sulfonate (known as the PECHS anion) is a fluorinated hydrocarbon sulfonated anion having a molecular weight of 461 which has been used as a counterion with cationic dyes to increase their solubility in organic solvents such as MEK (see for example U.S. Pat. Nos. 5,314,795 and 5,324,627). However, it has been noted that, at high dye loadings in organic binder solutions, the PECHS anion can cause coating defects such as fisheyes. The PECHS anion is also more expensive than many simpler anions.

$Ar_4B^-$, in the form of tetrakis(pentafluorophenyl) borate has been reported as a counterion in the study of the photochemistry of cationic cyanine dyes by X. Yang, A. Zaitsev, B. Sauerwein, S. Murphy, and G. B. Schuster, J. Am. Chem. Soc., 1992, 114, pp. 793–794. $Ar_4B^-$, in the form of tetrakis[3,5-bis(trifluoromethyl)phenylborate (TFPB) has been used as a counterion in near infrared (NIR) absorbing cyanine dyes used in laser optical recording media in JP 0157431. TFPB has also been used as a lipophilic stable anionic agent in the solvent extraction of alkali metal cations (e.g., Li, Na, K, Rb, and Cs) by H. Nishida, et al. Bull. Chem. Soc. Jpn, 1984, 57, pp. 2600–2604. This same anion has been used as-a phase transfer catalyst in diazo coupling reactions by H. Iwamoto, et al., Bull. Chem. Soc. Jpn., 1983, 57, pp. 796–801.

Initiator and catalyst salts having as the anionic portion a boron-centered anion have been reported in copending application U.S. Set. No. 08/097/279 filed Jul. 23, 1993, which is hereby incorporated by reference. The non-nucleophilic anion is of the formula:

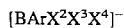

$$[BArX^2X^3X^4]^-$$

wherein:

B is boron in a valence state of 3;

Ar is a halogen substituted aromatic hydrocarbon radical containing from about 6 to about 30 carbon atoms and may be linked to one or more X groups through a stable bridging group; and $X^2$, $X^3$ and $X^4$ are radicals selected, independently, from the group consisting of halide radicals, hydrocarbyl radicals containing from 1 to about 30 carbon atoms, substituted hydrocarbyl radicals containing from 1 to about 30 carbon atoms, wherein one or more of the hydrogen atoms is replaced by a halogen atom, dialkylamido radicals, hydroxide, alkoxide and aryloxide radicals, hydrocarbyl-mercaptide and -carboxylate radicals, wherein the alkyl and aryl hydrocarbyl portions of the radicals contain from 1 to about 30 carbon atoms, and hydrocarbon substituted metal (organometalloid) radicals, wherein each hydrocarbyl substitution contains from 1 to about 20 carbon atoms and the metal is selected from Group IVA of the Periodic Table of the Elements (e.g., Si, Ge, Sn, etc.). These non-nucleophilic salts are reported to provide improved solubility. In the case where the non-nucleophilic salt is a photoinitiator, improvements in photoreactivity and wavelength response are often seen.

Bis(perfluoroalkylsulfonyl)methides (e.g., U.S. Pat. Nos. 4,039,521; 4,049,861; 4,069,368; 4,100,134; 4,115,295, and 5,136,097) and bis(perfluoroalkylsulfonyl)imides (e.g., U.S. Pat. Nos. 4,031,036; 4,387,222; 4,247,674; 4,429,093,) have been used as anions for catalysts and latent thermal catalysts. Other patents show improvements in the use of those anions and their synthesis, such as U.S. Pat. Nos. 3,704,311; 3,758,531; 3,758,591; 3,758,952; and 3,758,953; and J. N. Meussdorffer, et al., Chem.Ztg., 1972, 38, p. 582.

The thermal decomposition chemistry of a tris-(perfluoromethylsulfonyl)methide salt of benzene diazonium cation was studied by both Y. L. Yagupolskii, et al., J. Org. Chem.

U.S.S.R. (Engl. Transl.), 1990, 26, 584–5; and S. Z. Zhu, et al., Inorg. Chem., 1993, 32, pp.223–226. The latter also studied the thermal decomposition chemistry of the bis(perfluoromethylsulfonyl)imide salt of a benzene diazonium cation.

BRIEF DESCRIPTION OF THE INVENTION

Cationic dyes associated with a) imide anions containing at least one highly fluorinated alkyl or perfluoroalkylsulfonyl group, b) methide anions containing at least two highly fluorinated alkyl or perfluoroalkyl sulfonyl groups or c) (highly fluorinated alkyl or perfluoroalkyl) aryl]borate anions (e.g., [perfluoroalkyl]phenyl) display improved solubility in organic media. These anions are very stable, non-nucleophilic, and can display reduced redox reactivity.

DETAILED DESCRIPTION OF THE INVENTION

The solubility of cationic dye materials in organic solvents and particularly in low polarity solvents such as methyl ethyl ketone can be improved by using particular classes of counterions in association with the cations. Cationic dyes can display improved solubility in organic solvents, particularly solvents such as ketones and methyl ethyl ketone, when associated with the anions of the present invention.

The broad class of cationic dyes recognized in the dye and photographic industries may be used in the practice of the present invention. Cationic dyes are an art recognized class of materials as exemplified by K. Venkataraman, *The Chemistry of Synthetic Dyes*, Volume IV, 1971, Academic press, N.Y. and London, Chapter IV, "Cationic Dyes For Synthetic fibers", pp. 161–210. Cationic dyes may include many different chemical classes such as Di- and TriArylmethanes, Azine dyes, Cyanine and Merocyanine dyes, Styryl dyes, etc., and other classes of dyes with pendent cationic functionalities (e.g., Azo dyes and Anthraquinone dyes).

The anions of the present invention may be generally classified as highly fluorinated (including perfluorinated) alkylsulfonyl methides, iraides, and polyhighlyfluorinated (including perfluorinated) arylborates. The methides and imides may also be cyclic as long as they are cycloaliphatic. The alkyl chains may be from 1–20 carbon atoms, with 1–12 carbon atoms preferred. The alkyl chains may be straight or branched. Perfluorinated groups in such compounds are usually defined as an $R_f$ group. $R_f$ is a monovalent fluorinated saturated aliphatic radical containing at least one carbon atom. Where said radical contains a plurality of carbon atoms in a skeletal chain, such chain may be branched or cyclic but preferably is a straight chain. Said skeletal chain of carbon atoms can be interrupted by hetero atoms or radicals, such as divalent oxygen or trivalent nitrogen atoms, each of which is bonded only to carbon or atoms, but preferably where such hetero moieties are present, such skeletal chain does not contain more than one said hetero moiety for every two carbon atoms. An occasional carbon-bonded hydrogen atom, bromine atom, or chlorine atom may be present; where present, however, they preferably are present not more than once for every two carbon atoms. Thus, the non-skeletal valence bonds are preferably carbon-to-fluorine bonds, that is, $R_f$ is preferably perfluorinated. The total number of carbon atoms in $R_f$ can vary and be, for example, 1 to 18, preferably 1 to 8. Where $R_f$ is or contains a cyclic structure, such structure preferably has 5 or 6 ring members, 1 or 2 of which can be said hetero atoms, e.g., oxygen and/or nitrogen. The radical, $R_f$, is also one which is free of ethylenic or other carbon-to-carbon unsaturation, that is, it is saturated aliphatic, cycloaliphatic, or heterocyclic radical. Examples of $R_f$ radicals are fluorinated alkyl, e.g., $CF_3$—, and alkoyoxyalkyl, e.g., $CF_3OCF_2$—, said radicals being preferably perfluorinated, straight chain aliphatic radicals consisting only of carbon and fluorine atoms and having 1 to 8 carbon atoms therein. If two $R_f$ radicals are present in the same formula, $R_f$ can be the same or different.

The above-described bis(fluoroaliphaticsulfonyl)imides-occasionally referred to hereinafter as disulfonyl imides for purposes of brevity-can be prepared from fluoroaliphaticsulfonyl fluorides, $R_fSO_2F$, by procedures described in "Chemiker-Zeitung", 96 (10) 582 (1972) and German Offenlegungsschrift 2,239,817 (1974) (the latter disclosing that the disulfonyl imides are useful as catalysts in esterification). By "highly fluorinated" is meant that the degree of fluorination on the chain is sufficient to provide the chain with properties similar to those of a perfluorinated chain. More particularly, a highly fluorinated alkyl group will have more than half the total number of hydrogen atoms on the chain replaced with fluorine atoms. Although hydrogen atoms may remain on the chain, it is preferred that all hydrogen atoms be replaced with fluorine to form a perfluoroalkyl group, and that any hydrogen atoms above the at least half replaced with fluorine which are not replaced with fluorine be replaced with bromine and or chlorine. It is more preferred that at least two out of three hydrogens on the alkyl group be replaced with fluorine, still more preferred that at least three of four hydrogen atoms be replaced with fluorine and most preferred that all hydrogen atoms be replaced with fluorine to form a perfluorinated alkyl group.

Examples of anions useful in the practice of the present invention include: $(CF_3SO_2)_2HC^-$, $(C_6F_{17}SO_2)_2HC^-$, $(C_2F_5SO_2)_2N^-$, $(C_4F_9SO_2)_2N^-$, $(C_{20}F_{41}SO_2)_2HC^-$, $CH_3(CF_3SO_2)_2C^-$, $CH_3(CF_3CFClCF_2SO_2)_2C^-$, $C_2H_5(CF_3CF_2CFClSO_2)_2C^-$, $(C_8F_{17}SO_2)_3C^-$, $(C_5F_{11}CFClSO_2)_3C^-$, $(CF_3SO_2)_3C^-$, $(CF_3SO_2)_2N^-$, $(C_4F_9SO_2)_3C^-$, $(CF_3SO_2)_2(C_4F_9SO_2)C^-$, $(CF_3SO_2)(C_4F_9SO_2)N^-$, tetrakis(3,5-bis(trifluoromethyl)phenyl) borate, $((CF_3)_2NC_2F_4SO_2)(CF_3SO_2)N^-$,

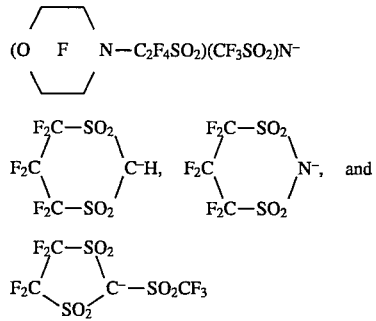

$((CF_3)_2NC_2F_4SO_2)(CF_3SO_2)_2C^-(C_6F_5)_4B^-$, and the like.

These anions may be associated with functional cations in organic solvent based systems and coated Out with reduced coating defects, both because of the wider array of solvents which may be used and because of the increased solubility of the salts in the solvents. For example, polymerizable systems comprising polymerizable monomers, thermal initiators, photoinitiators, or catalysts for inducing polymerization of the monomers (e.g., cationic polymerization, free radical initiation, Brönsted acid catalysis, Lewis Acid catalysis, etc), and a solvent (or free of non-polymerizable solvent in neat systems) are systems which can particularly benefit from the practice of the present invention. In addition to the association of the anions of the present invention with the initiators, the spectral sensitizing dyes used with the photoinitiators may also have the anions of the present invention associated with them to improve their solubility and stability in the polymerized product.

EXAMPLES

Organic solvent soluble salts of the present invention can be conveniently prepared by combining the desired cationic species with the desired anionic species in a metathesis reaction.

Example 1

The perchlorate salt of dye I (hereinafter HMD)

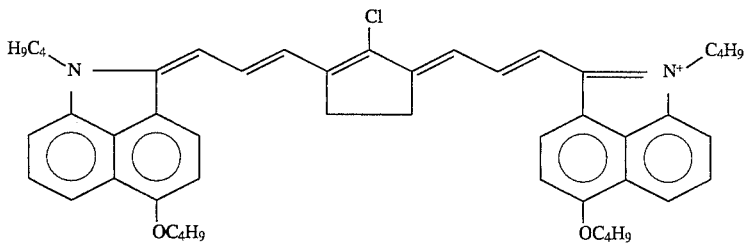

is very insoluble in MEK. An MEK soluble derivative was prepared by first adding HMD perchlorate (0.5 g), Fluorad Lithium Trifluoromethanesulfonimide Battery Electrolyte HQ-115 $(CF_3SO_2)_2N^-Li^+$ (0.19 g) (available from 3M Co.), and 100 ml MEK to a 250 ml sep aratory funnel. The mixture was shaken until everything dissolved. Ether (20 ml) was added to the MEK solution to increase its incompatibility with water. The MEK/ether layer was washed with 100 ml of water and 100 ml of saturated sodium chloride, dried over anhydrous magnesium sulfate, and evaporated to dryness on a rotary evaporator to give 0.6 g of the $(CF_3SO_2)_2N^-$ salt of HMD. The product (70 mg) was readily soluble in MEK (2 grams).

Example 2

Using the same procedure as Example 1, HMD perchlorate and $(CF_3SO_2)_3C^-Cs^+$, prepared as described in Seppelt and Turowsky, Inorg. Chem., 27, 2135–37 (1988), (0.72 g) yielded the $(CF_3SO_2)_3C^-$ salt of HMD (1.35 g) which was very soluble in MEK.

Example 3

The same procedure was followed as in Example 1 to prepare the $Ar_4B^-$ salt of HMD (0.73 g yield) from HMD perchlorate (0.37 g) and $Ar_4B^-Na^+\cdot3H_2O$ (0.44 g), where Ar is 3,5-bis(trifluoromethyl)phenyl, prepared as described in Kobayashi, Bull Chem. Soc. Jpn., 57, 2600–04 (1984),. The product was very soluble in MEK.

Example 4

The perchlorate salt of dye II (hereinafter Q Switch V, available from Eastman Kodak)

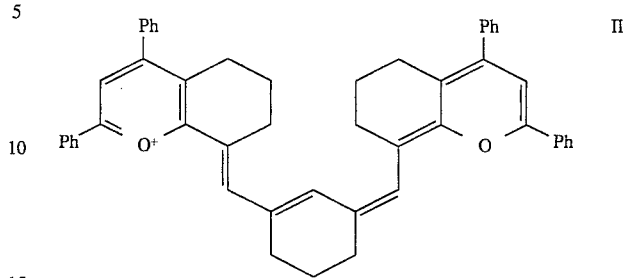

is too insoluble in MEK to be useful for making thin coatings (1) with adequate absorbance (1.0) at 1064 nm. The

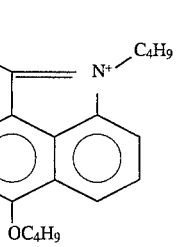

same procedure was followed as in Example 1 to prepare the $(CF_3SO_2)_3C^-$ salt of Q Switch V (0.16 g) from Q Switch V perchlorate (0.1 g) and $(CF_3SO_2)_3C^-Cs^+$ (0.07 g). The $(CF_3SO_2)_3C^-$ salt of Q Switch V (0.035 g) readily dissolved in MEK (1 g).

Example 5

Using the same procedure as Example 1, HMD perchlorate (1 g) and $(CF_3SO_2)_2CH^-Na^+$ (0.19 g), prepared or described in U.S. Pat. No. 3,776,960, gave the $(CF_3SO_2)_2CH^-$ salt of HMD (1.17 g), which was very soluble in MEK.

Example 6

A solution of $(CF_3SO_2)_2N^-Li^+$ (0.77 g) in 10 ml water was added all at once to a solution of methylene blue chloride trihydrate (1.0 g) in 250 ml water. A precipitate formed immediately which was filtered, washed with water, and dried to give 1.17 g of the $(CF_3SO_2)_2N^-$ salt of methylene blue. The product (0.01 g) was readily soluble in MEK (0.2 g).

Example 7

Tetramethylammonium hydroxide pentahydrate (0.047 g, 0.26 mmol) and bis(perfluorooctylsulfonyl)methane, $(C_8F_{17}SO_2)_2CH_2$, (0.25 g, 0.26 mmol) prepared as described by R. Koshar in U.S. Pat. No. 3,776,960, were added to 15 ml of methanol and refluxed until all the solids dissolved. Methylene blue chloride trihydrate, $C_{16}H_{18}N_3SCl\cdot3H_2O$, (0.097 g, 0.26 mmol) in 4 ml water was added dropwise to the hot methanol solution. After cooling, the precipitate was filtered, washed with copious amounts of water, and dried to yield the bis(perfluorooctylsulfonyl)methide salt of methylene blue (0.18 g, 53% yield). Both methylene blue chloride and the bis(perfluorooctylsulfonyl)methide salt of methylene blue had absorption maxima at 654 nm in methanol. Methylene blue chloride (0.025 g) was insoluble in 3 g of methylethylketone whereas the bis(perfluorooctylsulfonyl)methide salt of methylene blue (0.025 g) was totally soluble in 3 g of methylethylketone.

Example 8

This example illustrates the use of a cyclic perfluoroalkylsufonyl methide to impart improved solubility to a cationic dye. The perfluoroalkylsufonyl methide is prepared from the cyclic sulfone 4,4,5,5,6,6-hexafluorotetramethylene- 1,3-disulfone which has the following structure:

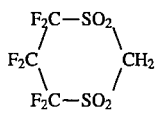

A solution of lithium hydroxide (0.021 g, 0.85 mol) in 2 ml of water was added dropwise to a rapidly stirred solution of 4,4,5,5,6,6-hexafluorotetramethylene-1,3-disulfone, $C_4H_2F_6S_2O_4$, (0.0265 g, 0.85 mol), prepared according to the method described in U.S. Pat. No. 3,776,960, in 1 ml of methanol. The resulting solution was stirred for 30 minutes. A solution of methylene blue chloride trihydrate (0.318 g, 0.85 mmol) in 4 ml water was added dropwise with rapid stirring to the cyclic fluorinated disulfone anion solution. A blue solid precipitated immediately. The precipitate was filtered, washed with copious amounts of water, and dried to give the cyclic perfluoroalkylsufonyl methide salt of methylene blue (0.37 g, 72% yield). Both methylene blue chloride and the cyclic perfluoroalkylsufonyl methide salt of methylene blue had absorption maxima at 654 nm in methanol. Methylene blue chloride (0.025 g) was insoluble in 3 g of methylethylketone whereas the cyclic perfluoroalkylsufonyl methide salt of methylene blue (0.025 g) was nearly completely soluble in 3 g of methylethylketone.

What is claimed:

1. A cationic dye in a ketone solvent, wherein the cationic dye has a counterion which comprises a linear, branched or cyclic highly fluorinated alkylsulfonyl methide or highly fluorinated alkyl sulfonyl imide.

2. The cationic dye of claim 1 wherein said counterion comprises a perfluorinated alkyl sulfonyl methide or perfluorinated alkylsulfonyl imide.

3. The cationic dye of claim 2 wherein said perfluorinated alkyl group is linear or branched and comprises from 1 to 12 carbon atoms.

4. The cationic dye of claim 3 wherein said cationic dye comprises a cationic cyanine or merocyanine dye.

5. The cationic dye of claim 2 wherein said solvent is methyl ethyl ketone.

6. The cationic dye of claim 2 wherein said cationic dye comprises a cationic cyanine or merocyanine dye.

7. The cationic dye of claim 1 wherein said solvent is methyl ethyl ketone.

8. The cationic dye of claim 7 wherein said cationic dye comprises a cationic cyanine or merocyanine dye.

9. The cationic dye of claim 1 wherein said cationic dye comprises a cationic cyanine or merocyanine dye.

10. A photosensitive compound in an organic binder wherein said photosensitive compound is spectrally sensitized, by a cationic dye having an anion selected from the group consisting of a) a highly fluorinated alkylsulfonyl methide, b) a highly fluorinated alkyl sulfonyl imide, and c) a tetrakis-(highly fluorinated alkyl)phenyl borate.

11. The photosensitive compound in an organic binder of claim 10 wherein said anion is selected from a) and b).

12. The photosensitive compound in an organic binder of claim 11 wherein said photosensitive compound comprises a photocatalyst for polymerization.

13. The photosensitive compound in an organic binder of claim 12 wherein a monomer polymerizable by species photoreleased by said photocatalyst are present in solution with said binder.

14. A photosensitive compound in an organic solution wherein said photosensitive compound is spectrally sensitized by a cationic dye having an anion selected from the group consisting of a) a highly fluorinated alkylsulfonyl methide, b) a highly fluorinated alkyl sulfonyl imide, and c) a tetrakis-(highly fluorinated alkyl)phenyl borate.

15. The photosensitive compound in an organic solution of claim 14 wherein a polymerizable monomer is present in said solution.

16. The photosensitive compound in an organic solution of claim 15 wherein said anion comprises a perfluorinated alkylsulfonyl methide or a perfluorinated alkylsulfonyl amide.

17. The photosensitive compound in an organic solution of claim 16 wherein alkyl groups in said alkylsulfonyl imides or methides have from 1 to 12 carbon atoms per alkyl group.

\* \* \* \* \*